(12) United States Patent
Lee et al.

(10) Patent No.: US 11,658,589 B2
(45) Date of Patent: May 23, 2023

(54) ELECTRICALLY COMMUTATED MOTOR DRIVING DEVICE AND CONTROL METHOD THEREOF

(71) Applicant: Delta Electronics, Inc., Taoyuan (TW)

(72) Inventors: Yu-Wei Lee, Taoyuan (TW);
Shang-Wen Hsu, Taoyuan (TW);
Wei-Shuo Tseng, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 0 days.

(21) Appl. No.: 17/474,898

(22) Filed: Sep. 14, 2021

(65) Prior Publication Data

US 2021/0408947 A1 Dec. 30, 2021

Related U.S. Application Data

(63) Continuation of application No. 16/156,315, filed on Oct. 10, 2018, now abandoned.

(30) Foreign Application Priority Data

Dec. 1, 2017 (CN) .......................... 201711249935.3

(51) Int. Cl.
*H02P 6/17* (2016.01)
*H02P 6/28* (2016.01)
(Continued)

(52) U.S. Cl.
CPC .......... *H02P 6/17* (2016.02); *G01R 19/16528* (2013.01); *H02H 7/0833* (2013.01);
(Continued)

(58) Field of Classification Search
CPC .... H02P 6/12; H02P 6/17; H02P 1/029; H02P 8/36; H02P 29/024; G01R 19/00; G01R 31/00; H02H 7/00
See application file for complete search history.

(56) References Cited

U.S. PATENT DOCUMENTS 9,621,080 B2  4/2017  Beifus
2002/0185926 A1  12/2002  King
(Continued)

FOREIGN PATENT DOCUMENTS

| CN | 101394144 A | 3/2009 |
| CN | 203883717 U | 10/2014 |
| CN | 104702191 A | 6/2015 |

*Primary Examiner* — Said Bouziane
(74) *Attorney, Agent, or Firm* — Muncy, Geissler, Olds & Lowe, P.C.

(57) ABSTRACT

An electronically commutated motor driving module for driving a motor includes a voltage detector, an electronically commutated motor driver, a current detector, a voltage converter, and a controller. The voltage detector detects supply voltage to generate a voltage detection signal. The electronically commutated motor driver is supplied by the supply voltage to generate, according to an electronically commutated signal, an operating current for driving the motor. The current detector detects the operating current to generate a current detection signal. The voltage converter converts the supply voltage into an internal voltage. The controller is supplied by the internal voltage and generates the electronically commutated signal according to a plurality of control parameters. When the controller determines that a specific event has happened according to the control parameters, the controller stops generating the electronically commutated signal and then stores the control parameters.

8 Claims, 4 Drawing Sheets

(51) Int. Cl.
  *H02H 7/08* (2006.01)
  *G01R 19/165* (2006.01)
  *H02P 29/024* (2016.01)
  *H02H 7/09* (2006.01)
  *H02P 6/12* (2006.01)
  *H02H 7/093* (2006.01)

(52) U.S. Cl.
  CPC .............. *H02H 7/09* (2013.01); *H02P 6/28* (2016.02); *H02P 29/027* (2013.01); *H02H 7/093* (2013.01); *H02P 6/12* (2013.01)

(56) References Cited

U.S. PATENT DOCUMENTS

| | | |
|---|---|---|
| 2007/0114956 A1 | 5/2007 | Hashimoto |
| 2012/0134184 A1 | 5/2012 | Park |
| 2013/0107401 A1 | 5/2013 | Helt |
| 2013/0193894 A1 | 8/2013 | Kiguchi et al. |
| 2014/0368139 A1 | 12/2014 | Zhou |
| 2016/0334810 A1 | 11/2016 | Koehl |
| 2017/0373631 A1 | 12/2017 | Ortmann |

[[US 11,658,589 B2]]

ELECTRICALLY COMMUTATED MOTOR DRIVING DEVICE AND CONTROL METHOD THEREOF

CROSS REFERENCE TO RELATED APPLICATIONS

This application is a Continuation of pending U.S. patent application Ser. No. 16/156,315, filed Oct. 10, 2018 and entitled "ELECTRICALLY COMMUTATED MOTOR DRIVING DEVICE AND CONTROL METHOD THEREOF.", which claims priority of China Patent Application No. 201711249935.3, filed on Dec. 1, 2017, the entirety of which are incorporated by reference herein.

BACKGROUND OF THE INVENTION

Field of the Invention

The disclosure relates generally to an electrically commutated motor driving device and a method thereof.

Description of the Related Art

The control parameters for controlling an electrically commutated motor are periodically written into a non-volatile and voltage-independent storage device after being powered ON. However, when the control parameters are periodically written into such a storage device, the latest control parameters may not be completely recorded due to the limited read-and-write counts of the storage device when it has been powered ON or OFF abnormally, when it operates under an abnormal supply voltage, or in the event of other abnormal states.

In addition, when the control parameters are periodically written into the storage device, the resources of the controller should be occupied, and the power consumption of the storage device should be increased as well. Therefore, it is necessary to improve the method of writing the control parameters into the storage device for improving the operation efficiency of the whole electrically commutated motor controller.

BRIEF SUMMARY OF THE INVENTION

Since the electrically commutated motor driving device provided herein stores the control parameters in the storage device according to whether a specific event has occurred, the number of times the storage device is written into is greatly reduced, which contributes to lengthening the operational lifespan of the storage device, as well as to reducing both the number of resources required by the controller and the power consumption when writing into the storage device.

In an embodiment, an electrically commutated motor driving device for driving a motor comprises a voltage detector, an electrically commutated motor driver, a current detector, a voltage converter, and a controller. The voltage detector detects supply voltage to generate a voltage detection signal. The electrically commutated motor driver is supplied by the supply voltage and generates an operating current according to an electrically commutated signal to drive the motor. The current detector detects the operating current to generate a current detection signal. The voltage converter converts the supply voltage into an internal voltage. The controller is supplied by the internal voltage and generates the electrically commutated signal according to a plurality of control parameters. When the controller determines, according to the control parameters, that a specific event has occurred, the controller first stops generating the electrically commutated signal and then stores the control parameters.

According to an embodiment of the invention, when the controller receives a shutdown instruction from a host, the controller first stops generating the electrically commutated signal and then stores the control parameters.

According to an embodiment of the invention, the electrically commutated motor driving device further comprises a storage device. The storage device is configured to store the control parameters. The storage device and the controller are physically separated, wherein the control parameters comprise the rotating-speed value of the motor, the current value of the operating current, and the voltage value of the supply voltage.

According to an embodiment of the invention, the specific event comprises a voltage abnormal event, a current abnormal event, and a rotating-speed abnormal event. When the controller determines, according to the voltage signal, that the voltage value is outside a predetermined voltage range, the controller determines that the voltage abnormal event has occurred. When the controller determines, according to the current signal, that the current value exceeds a threshold current, the controller determines that the current abnormal event has occurred, wherein when the controller determines, according to a rotating-speed detection signal, that the rotating-speed value is outside a predetermined range, the controller determines that the rotating-speed abnormal event has occurred. The motor comprises a Hall device configured to detect the rotating-speed value to generate the rotating-speed detection signal.

According to an embodiment of the invention, the electrically commutated motor driving device further comprises an energy storage device. The energy storage device is coupled to the internal voltage. When the controller determines, according to the voltage signal, that the supply voltage is less than a predetermined voltage, the controller determines that the voltage abnormal event has occurred. The energy storage device maintains the internal voltage for a predetermined period so that the controller stops generating the electrically commutated signal and stores the control parameters in the storage device in the predetermined period.

According to an embodiment of the invention, when the controller receives the control parameters from a host, the controller immediately writes the control parameters into the storage device and generates the electrically commutated signal according to the control parameters stored in the storage device. A shutdown instruction is generated by the host.

In another embodiment, a control method for controlling an electrically commutated motor driver to drive a motor comprises: supplying the electrically commutated motor driver with a supply voltage; converting the supply voltage into an internal voltage; generating an operating current according to the internal voltage and a plurality of control parameters to drive the motor; determining, according to the control parameters, whether a specific event has occurred; and when determining that the specific event has occurred, first stopping generating the operating current and then storing the control parameters.

According to an embodiment of the invention, the control parameters are stored in a storage device, wherein the storage device and the controller are physically separated, wherein the control parameters comprise a rotating-speed value of the motor, a current value of the operating current, and a voltage value of the supply voltage.

According to an embodiment of the invention, the step of determining, according to the control parameters, whether a specific event has occurred further comprises: detecting the supply voltage to generate a voltage detection signal; when determining, according to the voltage detection signal, that the voltage value is outside a predetermined voltage range, determining that a voltage abnormal event has occurred; detecting the operating current to generate a current detection signal; when determining, according to the current value, that the operating current exceeds a threshold current, determining that a voltage abnormal event has occurred; receiving a rotating-speed detection signal, wherein the motor comprises a Hall device configured to measure the rotating-speed value to generate the rotating-speed detection signal; and when determining, according to the rotating-speed detection signal, that the rotating-speed value is outside a predetermined range, determining that a rotating-speed abnormal event has occurred.

According to an embodiment of the invention, in the step of determining that a voltage abnormal event has occurred based on the operating current exceeding the threshold current, the step further comprises: maintaining the internal voltage for a predetermined period by using an energy storage device; and during the predetermined period, stopping generating the operating current and writing the control parameters into the storage device.

According to an embodiment of the invention, the control method further comprises: receiving the control parameters from a host; when the control parameters are received, immediately writing the control parameters into the storage device; and generating the operating current according to the control parameters stored in the storage device.

In yet another embodiment, a control method for controlling an electrically commutated motor driver to drive a motor comprises: supplying the electrically commutated motor driver with a supply voltage; detecting the supply voltage to generate a voltage detection signal; converting the supply voltage into an internal voltage; controlling the electrically commutated motor driver according to the internal voltage and a plurality of control parameters so that the electrically commutated motor driver generates an operating current; receiving a shutdown instruction from a host; and when the shutdown instruction is received, first stopping controlling the electrically commutated motor driver and then storing the control parameters.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

Figure 1:
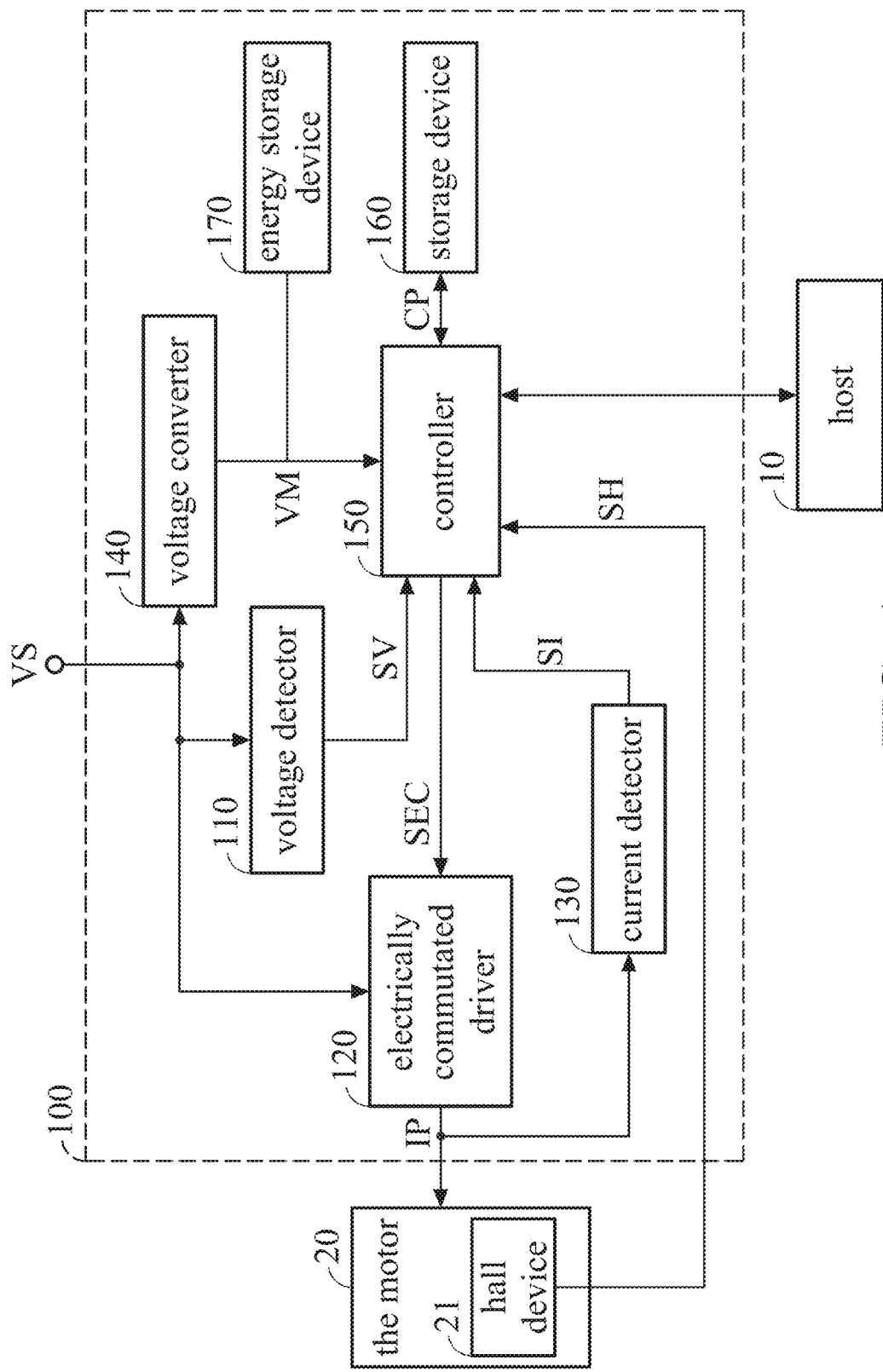
FIG. 1 is a block diagram of an electrically commutated motor driving device in accordance with an embodiment of the invention.

This description is made for the purpose of illustrating the general principles of the invention and should not be taken in a limiting sense. In addition, the present disclosure may repeat reference numerals and/or letters in the various examples. This repetition is for the purpose of simplicity and clarity and does not in itself dictate a relationship between the various embodiments and/or configurations discussed. The scope of the invention is best determined by reference to the appended claims.

It should be understood that the following disclosure provides many different embodiments, or examples, for implementing different features of the application. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, so that the features may not be in direct contact.

FIG. 1 is a block diagram of an electrically commutated motor driving device in accordance with an embodiment of the invention. As shown in FIG. 1, the electrically commutated driving device 100 includes a voltage detector 110, an electrically commutated driver 120, a current detector 130, a voltage converter 140, a controller 150, a storage device 160, and an energy storage device 170, in which the electrically commutated motor device 100 communicates with an external host 10.

The voltage detector 110 is configured to detect the supply voltage VS to generate the voltage detection signal SV. The electrically commutated motor driver 120, which is supplied by the supply voltage VS, generates an operating current IP to control the motor 20 according to an electrically commutated signal SEC. the current detector 130 generates a current detection signal SI according to the operating current IP. According to an embodiment of the invention, the current detector 130 directly detects the operating current IP to generate the current detection signal SI. According to another embodiment of the invention, the current detector 130 monitors a monitor current (not shown in FIG. 1) to generate the current detection signal SI, in which the monitor current is the operating current IP divided by a factor and the designer may decide the factor. According to an embodiment of the invention, the motor 20 includes a Hall device 21, in which the Hall device 21 is configured to detect the rotating-speed of the motor 20 to generate a rotating-speed detection signal SH.

The voltage converter 140 is configured to convert the supply voltage VS into an internal voltage VM. The controller 150 is supplied by the internal voltage VM and generates the electrically commutated signal SEC according to a plurality of control parameters CP. The storage device 170 is coupled to the internal voltage VM. According to an embodiment of the invention, the control parameters CP includes the rotating-speed value of the motor 20, the current value of the operating current IP, the voltage value of the supply voltage VS, and any other information related to the controlling. The controller 150 generates the electrically commutated signal SEC according to the control parameters CP so that the electrically commutated motor driver 120 is controlled according to the electrically commutated signal SEC to meet all the requirements of the control parameters CP.

The storage device 160 is configured to store the control parameters CP, in which the storage device 160 and the controller 150 are physically separated. According to an embodiment of the invention, the storage device 160 may be a non-volatile and voltage-independent storage device. According to other embodiments of the invention, the storage device 160 may be a erasable programmable read-only memory (EPROM), an electrically erasable programmable read-only memory (EEPROM), or other known or unknown similar storage devices.

According to an embodiment of the invention, when the controller 150 determines, according to the control parameters CP, that a specific event has occurred, the controller 150 first stops generating the electrically commutated signal SEC and then stores the control parameters CP in the storage device 160. According to an embodiment of the invention, the specific event includes a voltage abnormal event, a current abnormal event, and a rotating-speed abnormal event. In the following paragraphs, the voltage abnormal event, the current abnormal event, and the rotating-speed abnormal event will be discussed in detail.

According to an embodiment of the invention, when the controller 150 determines, according to the voltage signal SV, that the supply voltage VS is outside of the predetermined voltage range, the controller 150 determines that a voltage abnormal event has occurred. For example, it is assumed that the predetermined voltage range is from 200V to 500V.

According to an embodiment of the invention, when the controller 150 determines, according to the voltage detection signal SV, that the supply voltage VS exceeds 500V, the controller determines that a voltage abnormal event has occurred so that generation of the electrically commutated signal SEC is stopped and the control parameters CP are then stored in the storage device 160. When the supply voltage VS goes back to normal, the controller 150 accesses the control parameters CP stored in the storage device 160 to control the electorally commutated motor driver 120 so that the electrically commutated motor driver 120 goes back to the previous operation state.

According to another embodiment of the invention, when the controller 150 determines, according to the voltage detection signal SV, that the supply voltage VS is less than 200V, the controller 150 determines that a voltage abnormal event has occurred. Since the supply voltage VS is too low, the voltage converter 140 cannot operate normally so that the internal voltage VM is gradually decreased. Meanwhile, the energy storage device 170 is configured to keep the internal voltage VM for a predetermined period so that the controller 150 is able to stop generating the electrically commutated signal SEC and then to store the control parameters CP in the storage device 160. When the supply voltage VS goes back to normal, the controller 150 accesses the control parameters CP stored in the storage device 160 to restore the electrically commutated motor driver 120 to the previous operation state.

According to an embodiment of the invention, the energy storage device 170 is a capacitor. According to another embodiment of the invention, the energy storage device 170 is a battery. According to other embodiments of the invention, the energy storage device 170 may be any other device configured to keep the internal voltage VM. According to an embodiment of the invention, the predetermined period is several tens mini-seconds. According to other embodiments of the invention, the designer may modify the length of the predetermined period according to the operation speed of the circuit.

According to another embodiment of the invention, when the controller 150 determines, according to the current detection signal SI, that the operating current IP exceeds a threshold current, the controller 150 determines that a current abnormal event has occurred. When the current abnormal event has occurred, the controller 150 immediately stops generating the electrically commutated signal SEC and then stores the control parameters CP in the storage device 160. In addition, in next time for the controller 150 to control the electrically commutated motor driver 120, the controller 150 generates the electrically commutated signal SEC according to the control parameters CP stored in the storage device 160 so that the electrically commutated motor driver 120 meets the requirements of the control parameters CP.

According to another embodiment of the invention, when the controller 150 determines, according to the rotating-speed detection signal SH, that the rotating-speed of the motor 20 is not in the predetermined range, the controller 150 determines that a rotating-speed abnormal event has occurred. When the rotating-speed abnormal event has occurred, the controller 150 immediately stops generating the electrically commutated signal SEC and then stores the control parameters CP in the storage device 160. In addition, in next time for the controller 150 to control the electrically commutated motor driver 120, the controller 150 generates the electrically commutated signal SEC according to the control parameters CP stored in the storage device 160 so that the electrically commutated motor driver 120 meets the requirements of the control parameters CP.

According to another embodiment of the invention, when the controller 150 receives the shutdown instruction from the external host 10, the controller 150 determines that a shutdown event has occurred. When the shutdown event has occurred, the controller 150 sequentially stops generating the electrically commutated signal SEC and stores the control parameters CP in the storage device 160. When the motor 20 is restarted, the controller 150 immediately generates the electrically commutated signal SEC according to the control parameters CP stored in the storage device 160 to control the electrically commutated motor driver 120.

According to other embodiments of the invention, when the external host 10 issues an instruction to modify the control parameters CP of the controller 150 controlling the electrically commutated motor driver 120, the controller 150 immediately stores the new control parameters CP in the storage device 160 once the new control parameters CP have been received. Therefore, no matter that the power is ON or OFF, the new control parameters CP are stored in the storage device 160 and the controller 150 is able to control the electrically commutated motor driver 120 according to the new control parameters CP.

Figure 2:
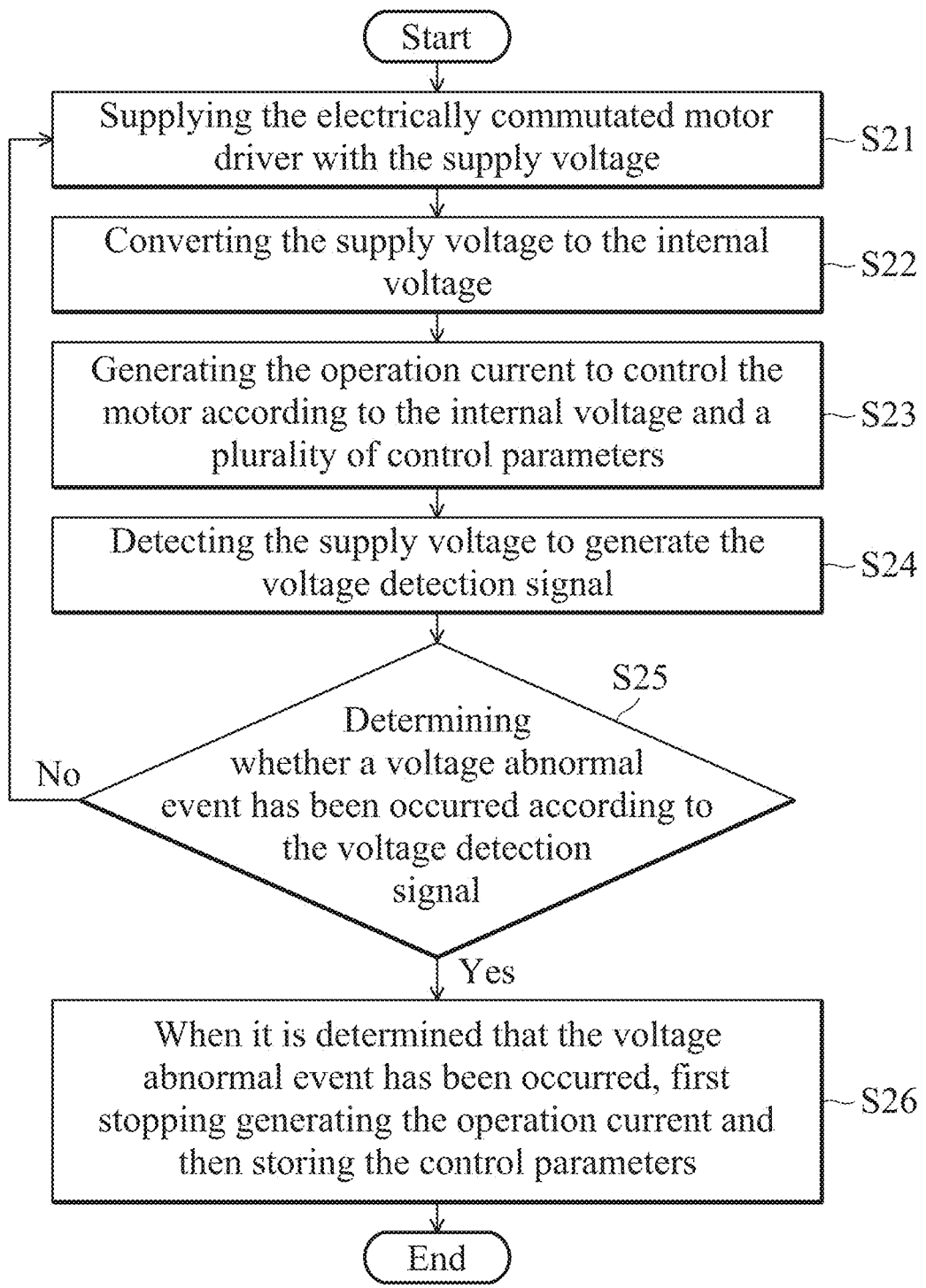
FIG. 2 is a flow chart of a control method in accordance with an embodiment of the invention.

FIG. 2 is a flow chart of a control method in accordance with an embodiment of the invention. The description of FIG. 2 in the following paragraphs may be accompanied by FIG. 1 for a more detailed explanation. As shown in FIG. 2, the supply voltage VS is supplied to the electrically commutated motor driver 120 (Step S21). The voltage converter 140 converts the supply voltage VS into the internal voltage VM (Step S22) for supplying the controller 150.

Then, the controller 150 controls the electrically commutated motor driver 120 according to the internal voltage VM and a plurality of control parameters CP so that the electrically commutated motor driver 120 generates the operating current IP (Step S23) to operate the motor 20. According to an embodiment of the invention, since the controller 150 is supplied by the internal voltage VM, the controller 150 would not operate normally without the internal voltage VM. The voltage detector 110 detects the supply voltage VS to generate the voltage detection signal SV (Step S24). The controller 150 determines whether a voltage abnormal event has occurred according to the voltage detection signal SV (Step S25).

When the controller 150 determines that a voltage abnormal event has occurred, the controller 150 first stops the electrically commutated motor driver 120 generating the operating current IP and then stores the control parameters CP (Step S26). The control method returns to Step S25, and when the controller 150 determines that no voltage abnormal event has occurred, Step S21 is executed again.

Figure 3:
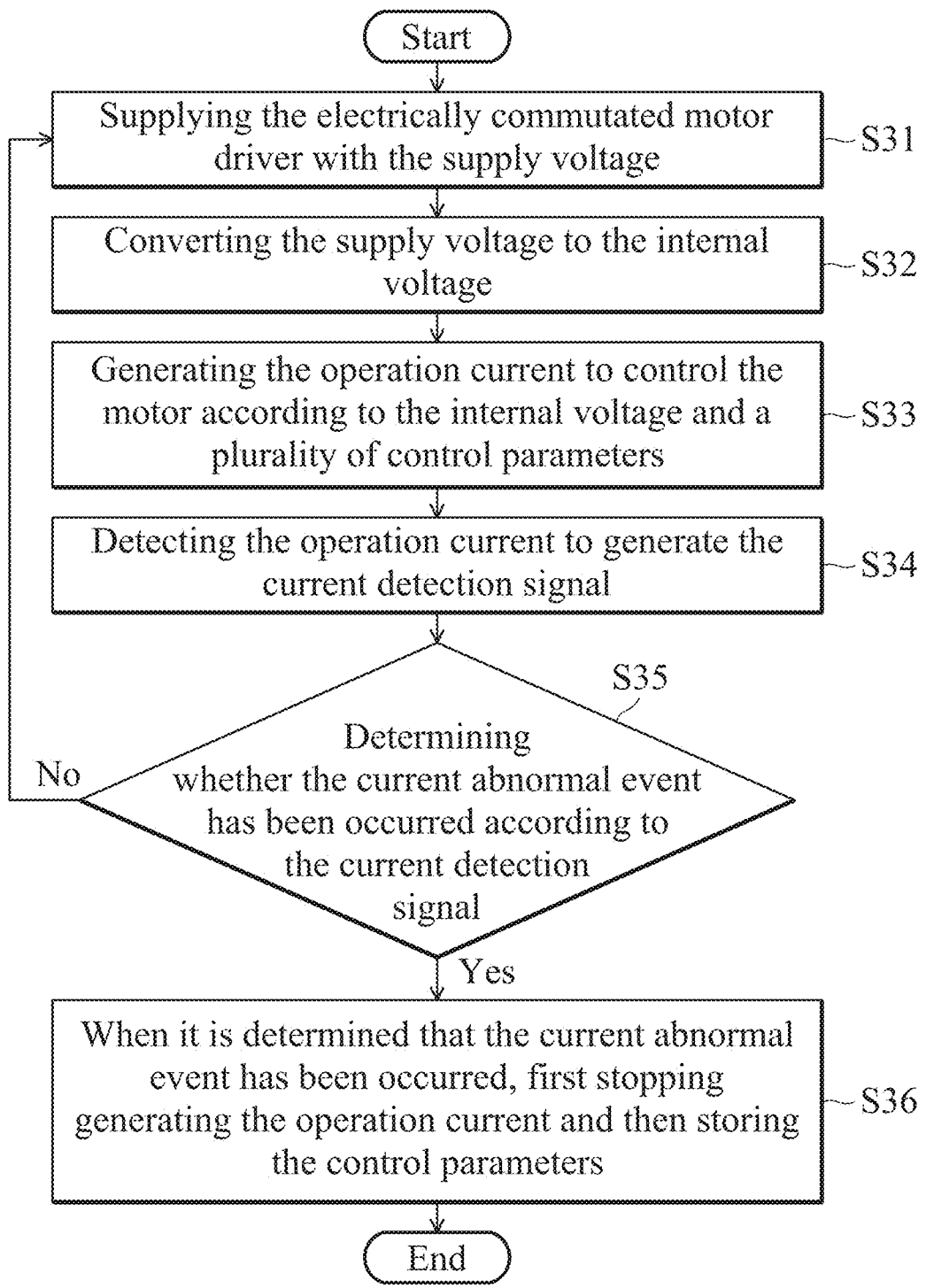
FIG. 3 is a flow chart of a control method in accordance with an embodiment of the invention.

FIG. 3 is a flow chart of a control method in accordance with an embodiment of the invention. The description of FIG. 3 in the following paragraphs may be accompanied by FIG. 1 for a more detailed explanation. As shown in FIG. 3, Step S31 to Step S33 are identical to Step S21 to Step S23 in FIG. 2, which are not repeated herein.

In Step S34, the current detector 130 detects the operating current IP to generate the current detection signal SI. In addition, the controller 150 determines whether a current abnormal event has occurred according to the current detection signal SI (Step S35). When the controller 150 determines that a current abnormal event has occurred, the controller first stops the electrically commutated motor driver 120 generating the operating current IP and then stores the control parameters CP (Step S36). The control method returns to Step S35, and when the controller 150 determines that no current abnormal event has occurred, Step S31 is executed again.

Figure 4:
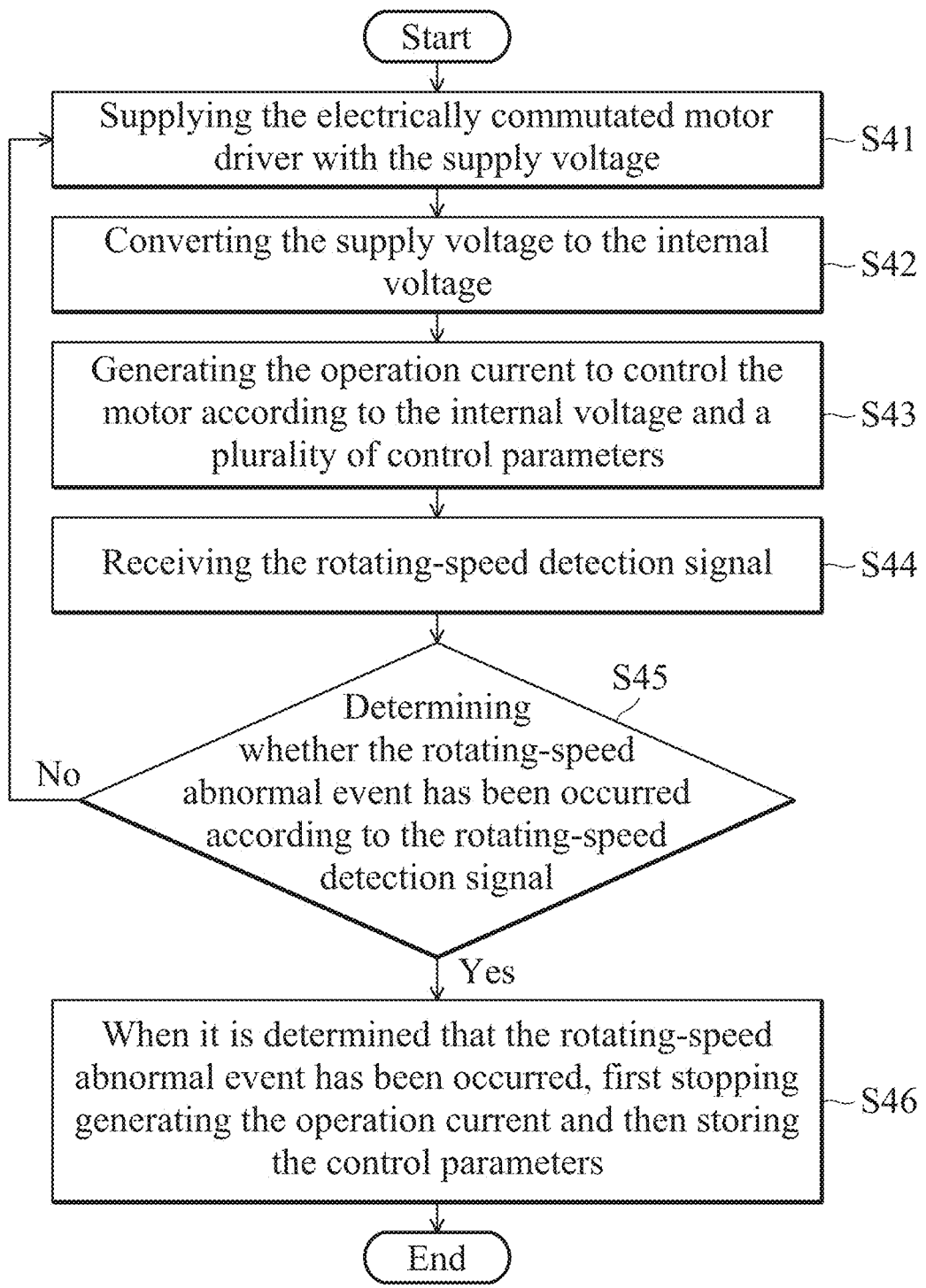
FIG. 4 is a flow chart of a control method in accordance with an embodiment of the invention.

FIG. 4 is a flow chart of a control method in accordance with an embodiment of the invention. The description of FIG. 4 in the following paragraphs may be accompanied by FIG. 1 for a more detailed explanation. As shown in FIG. 4, Step S41 to Step S43 are identical to Step S21 to Step S23 in FIG. 2 and Step S31 to Step S33 in FIG. 3, which are not repeated herein.

In Step S44, the rotating-speed detection signal SH is received. According to an embodiment of the invention, the motor 20 includes Hall device 21, in which the Hall device 21 is configured to detect the rotating-speed of the motor 20 to generate the rotating-speed detection signal SH. The controller 150 determines whether a rotating-speed abnormal event has occurred according to the rotating-speed detection signal SH (Step S45). When the controller 150 determines that a rotating-speed abnormal event has occurred, the controller 150 first stops the electrically commutated motor driver 120 generating the operating current IP and then stores the control parameters CP (Step S46). The control method returns to Step S45, and when the controller 150 determines that no current abnormal event has occurred, Step S41 is executed again.

Since the electrically commutated motor driving device 100 provided herein stores the control parameters CP in the storage device 160 according to whether a specific event has occurred, the number of times that storage device 160 is being written into is greatly reduced, which contributes to lengthening the life of the storage device 160, as well as to lowering both the number resources required by the controller 150 and the power consumption when writing into the storage device 160.

In addition, with assistance of the energy storage device 170, the controller 150 has a long enough period to stop controlling the electrically commutated motor driver 120 and to write the latest control parameters CP into the storage device 160 when the supply voltage VS is too low.

While the invention has been described by way of example and in terms of preferred embodiment, it should be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An electrically commutated motor driving device for driving a motor, comprising:
   a voltage detector, detecting a supply voltage to generate a voltage detection signal;
   an electrically commutated motor driver, supplied by the supply voltage and generating an operating current according to an electrically commutated signal to drive the motor;
   a current detector, detecting the operating current to generate a current detection signal;
   a voltage converter, converting the supply voltage into an internal voltage;
   a controller, supplied by the internal voltage and generating the electrically commutated signal according to a plurality of control parameters, wherein when the controller determines, according to the control parameters, that a specific event has occurred, the controller first stops generating the electrically commutated signal and then stores the control parameters prior to the moment at which the specific event is occurred, wherein when the controller receives a shutdown instruction from a host, the controller first stops generating the electrically commutated signal and then stores the control parameters,
   a storage device, configured to store the control parameters, wherein the storage device and the controller are physically separated, wherein the control parameters comprise a rotating-speed value of the motor, a current value of the operating current, and a voltage value of the supply voltage; and
   an energy storage device, coupled to the internal voltage, wherein when the controller determines, according to the voltage detection signal, that the supply voltage is less than a predetermined voltage, the controller determines that the voltage abnormal event has occurred, wherein the energy storage device maintains the internal voltage for a predetermined period so that the controller stops generating the electrically commutated signal and stores the control parameters in the storage device during the predetermined period.

2. The electrically commutated motor driving device of claim 1,
   wherein when the controller determines, according to the current detection signal, that the current value exceeds a threshold current, the controller determines that the current abnormal event has occurred wherein when the controller determines, according to the voltage detection signal, that the voltage value is outside a predetermined voltage range, the controller determines that the voltage abnormal event has occurred, wherein when the controller determines, according to the current detection signal, that the current value exceeds a threshold current, the controller determines that the current abnormal event has occurred.

3. The electrically commutated motor driving device of claim 1, wherein when the controller receives the control parameters from a host, the controller immediately writes the control parameters into the storage device and generates the electrically commutated signal according to the control parameters stored in the storage device, wherein a shutdown instruction is generated by the host.

4. An electrically commutated motor driving device for driving a motor, comprising:
  a voltage detector, detecting a supply voltage to generate a voltage detection signal;
  an electrically commutated motor driver, supplied by the supply voltage and generating an operating current according to an electrically commutated signal to drive the motor;
  a current detector, detecting the operating current to generate a current detection signal;
  a voltage converter, converting the supply voltage into an internal voltage;
  a controller, supplied by the internal voltage and generating the electrically commutated signal according to a plurality of control parameters, wherein when the controller determines, according to the control parameters, that a rotating-speed abnormal event has occurred, the controller first stops generating the electrically commutated signal and then stores the control parameters prior to the moment at which the rotating-speed abnormal event is occurred, wherein when the controller receives a shutdown instruction from a host, the controller first stops generating the electrically commutated signal and then stores the control parameters;
  a storage device, configured to store the control parameters, wherein the storage device and the controller are physically separated, wherein the control parameters comprise a rotating-speed value of the motor, a current value of the operating current, and a voltage value of the supply voltage; and
  an energy storage device, coupled to the internal voltage, wherein when the controller determines, according to the voltage detection signal, that the supply voltage is less than a predetermined voltage, the controller determines that a voltage abnormal event has occurred, wherein the energy storage device maintains the internal voltage for a predetermined period so that the controller stops generating the electrically commutated signal and stores the control parameters in the storage device during the predetermined period.

5. The electrically commutated motor driving device of claim 4, wherein when the controller determines, according to a rotating-speed detection signal, that the rotating-speed value is outside a predetermined range, the controller determines that the rotating-speed abnormal event has occurred, wherein the motor comprises a Hall device configured to detect the rotating-speed value to generate the rotating-speed detection signal.

6. A control method for controlling an electrically commutated motor driver to drive a motor, comprising:
  supplying the electrically commutated motor driver with a supply voltage;
  converting the supply voltage into an internal voltage by a voltage converter;
  generating, by a controller, an operating current according to the internal voltage and a plurality of control parameters to drive the motor, wherein the control parameters are stored in a non-volatile storage device, wherein the storage device and the controller are physically separated;
  determining, by the controller and according to the control parameters, whether a specific event has occurred;
  when determining that the specific event has occurred, first stopping generating the operating current and then storing the control parameters prior to the moment at which the specific event is occurred;
  wherein the control parameters comprise a rotating-speed value of the motor, a current value of the operating current, and a voltage value of the supply voltage;
  wherein the step of determining, according to the control parameters, the specific event has occurred further comprises:
  detecting the supply voltage to generate a voltage detection signal; and
  when determining, according to the voltage detection signal, that the voltage value is outside a predetermined voltage range, determining that a voltage abnormal event has occurred; and
  wherein after the step of determining that the voltage abnormal event has occurred, the control method further comprises:
  maintaining the internal voltage for a predetermined period by using an energy storage device; and
  during the predetermined period, stopping generating the operating current and writing the control parameters into the storage device.

7. The control method of claim 6, wherein the step of determining, according to the control parameters, the specific event has occurred further comprises:
  detecting the operating current to generate a current detection signal;
  when determining, according to the current value, that the operating current exceeds a threshold current, determining that a current abnormal event has occurred;
  receiving a rotating-speed detection signal, wherein the motor comprises a Hall device configured to measure the rotatin-speed value to generate the rotating-speed detection signal; and
  when determining, according to the rotating-speed detection signal, that the rotating-speed value is outside a predetermined range, determining that a rotating-speed abnormal event has occurred.

8. The control method of claim 6, further comprising:
receiving the control parameters from a host;
when the control parameters are received, immediately writing the control parameters into the storage device; and
generating the operating current according to the control parameters stored in the storage device.

* * * * *